United States Patent
Kakiuchi

(10) Patent No.: US 10,814,624 B2
(45) Date of Patent: Oct. 27, 2020

(54) LIQUID DISCHARGING APPARATUS AND WIRING MEMBER

(71) Applicant: BROTHER KOGYO KABUSHIKI KAISHA, Nagoya-shi, Aichi-ken (JP)

(72) Inventor: Toru Kakiuchi, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 16/573,382

(22) Filed: Sep. 17, 2019

(65) Prior Publication Data

US 2020/0094552 A1    Mar. 26, 2020

(30) Foreign Application Priority Data

Sep. 25, 2018    (JP) ................. 2018-178870

(51) Int. Cl.
  *B41J 2/14*     (2006.01)
  *H05K 1/14*     (2006.01)
  *H05K 3/36*     (2006.01)

(52) U.S. Cl.
  CPC ....... *B41J 2/14072* (2013.01); *B41J 2/14233* (2013.01); *H05K 1/147* (2013.01); *H05K 3/361* (2013.01); *B41J 2002/14241* (2013.01); *B41J 2002/14491* (2013.01); *B41J 2202/18* (2013.01); *H05K 2203/049* (2013.01)

(58) Field of Classification Search
  CPC .............. B41J 2/14072; B41J 2/14233; B41J 2002/14241; B41J 2002/14491; B41J 2202/18; H05K 1/147; H05K 3/361; H05K 2203/049
  See application file for complete search history.

(56) References Cited

U.S. PATENT DOCUMENTS

| | | | | |
|---|---|---|---|---|
| 5,670,994 A | * | 9/1997 | Kawaguchi | G02F 1/13452 257/E23.065 |
| 5,822,191 A | * | 10/1998 | Tagusa | H01L 24/86 361/751 |
| 2017/0266969 A1 | | 9/2017 | Kashimura | |

FOREIGN PATENT DOCUMENTS

| | | |
|---|---|---|
| JP | 2007-196455 A | 8/2007 |
| JP | 2017-164944 A | 9/2017 |

OTHER PUBLICATIONS

Machine translation of JP 2007-196455, published on Aug. 2007.*

\* cited by examiner

*Primary Examiner* — Huan H Tran
(74) *Attorney, Agent, or Firm* — Baker Botts L.L.P.

(57) ABSTRACT

A liquid discharging apparatus includes: liquid discharging modules which are arranged in a first direction along a predetermined plane; and a wiring member commonly joined to the liquid discharging modules. The wiring member includes: first parts joined to the liquid discharging modules, respectively, in a state that the first parts are arranged side by side in the first direction along the predetermined plane; second parts; and a sixth part. The second parts include: third parts extending from the first parts, respectively, in a second direction orthogonal to the first direction and along the predetermined plane, fourth parts extending in a third direction away from the predetermined plane, and fifth parts connected to the third parts and the fourth parts, respectively. Width in the first direction of each of the second parts is smaller than width in the first direction of the sixth part.

11 Claims, 10 Drawing Sheets

LIQUID DISCHARGING APPARATUS AND WIRING MEMBER

CROSS REFERENCE TO RELATED APPLICATION

The present application claims priority from Japanese Patent Application No. 2018-178870, filed on Sep. 25, 2018, the disclosure of which is incorporated herein by reference in its entirety.

BACKGROUND

Field of the Invention

The present disclosure relates to a liquid discharging apparatus and a wiring member.

Description of the Related Art

Conventionally, there is known a liquid discharging apparatus provided with a plurality of head chips arranged in a first direction; a control board controlling discharging (jetting) of an ink by the plurality of head chips; and a flexible wiring board (flexible print circuit) electrically connecting the plurality of head chips with the control board. In this liquid discharging apparatus, the flexible wiring board has a first part extending in a second direction orthogonal to the first direction and having a wide width in the first direction, and a second part extending in the second direction and having a narrow width in the first direction which is smaller than that of the first part. An end of the first part is branched into a plurality of second parts each of which is connected to one of the plurality of head chips. On the other hand, an end, of the second part, which is on the side opposite to the first part is connected to a connector of the control board. Namely, since the plurality of head chips are connected to the control board via the flexible wiring board which is provided commonly with respect to the plurality of head chips, it is possible to reduce the number of the connector in the control board (see Japanese Patent Application Laid-open No. 2007-196455).

SUMMARY

In a case that, in the liquid discharging apparatus described in Japanese Patent Application Laid-open No. 2007-196455, the flexible wiring board connects the plurality of head chips with the control board, the flexible wiring board is bent at the first part, of which width in the first direction is wide, in a direction away from the plurality of head chips. Specifically, the flexible wiring board is bent at the first part along a bending line extending in the first direction. Due to this configuration, in such a case that the bendability of the flexible wiring board is low and that for example, any external force is applied to the flexible wiring board when the flexible wiring board is (being) connected to the connector of the control board, there is such a fear that each of the second parts of the flexible circuit board and one of the plurality of head chips might peel off or detached from each other at a joining part therebetween.

In view of the above-described situation, the present disclosure has been made; an object of the present disclosure is to provide a liquid discharging apparatus in which the bendability of a flexible wiring board is satisfactory, and the flexible wiring board and each of the head modules are less likely to peel off or detached from each other at a joining part therebetween.

According to a first aspect of the present disclosure, there is provided a liquid discharging apparatus including: liquid discharging modules which are arranged in a first direction along a predetermined plane; and a wiring member commonly joined to the liquid discharging modules, wherein the wiring member includes: first parts joined to the liquid discharging modules, respectively, in a state that the first parts are arranged side by side in the first direction along the predetermined plane; and second parts including: third parts extending from the first parts, respectively, in a second direction orthogonal to the first direction and along the predetermined plane, fourth parts extending in a third direction away from the predetermined plane, and fifth parts connected to first ends of the third parts and second ends of the fourth parts, respectively, the first ends being located on a side opposite to the first parts in the second direction, the second ends being located on a side close to the predetermined plane in the third direction; and a sixth part commonly connected to third ends of the fourth parts, the third ends being located on a side far from the predetermined plane in the third direction; and width in the first direction of each of the second parts is smaller than width in the first direction of the sixth part.

According to a second aspect of the present disclosure, there is provided a wiring member including: a sixth part which extends in a predetermined direction; second parts each of which extends in the predetermined direction from an end, of the sixth part, on one side in the predetermined direction; and an eighth part which extends in an orthogonal direction orthogonal to the predetermined direction and which connects ends of the second parts on the one side in the predetermined direction, with each other, wherein in each of the second parts, width thereof in the orthogonal direction is smaller than length thereof in the predetermined direction, and the width thereof in the orthogonal direction is smaller than width in the orthogonal direction of the sixth part.

EMBODIMENT

<Overall Configuration of Ink-Jet Printer 11>

Figure 1:
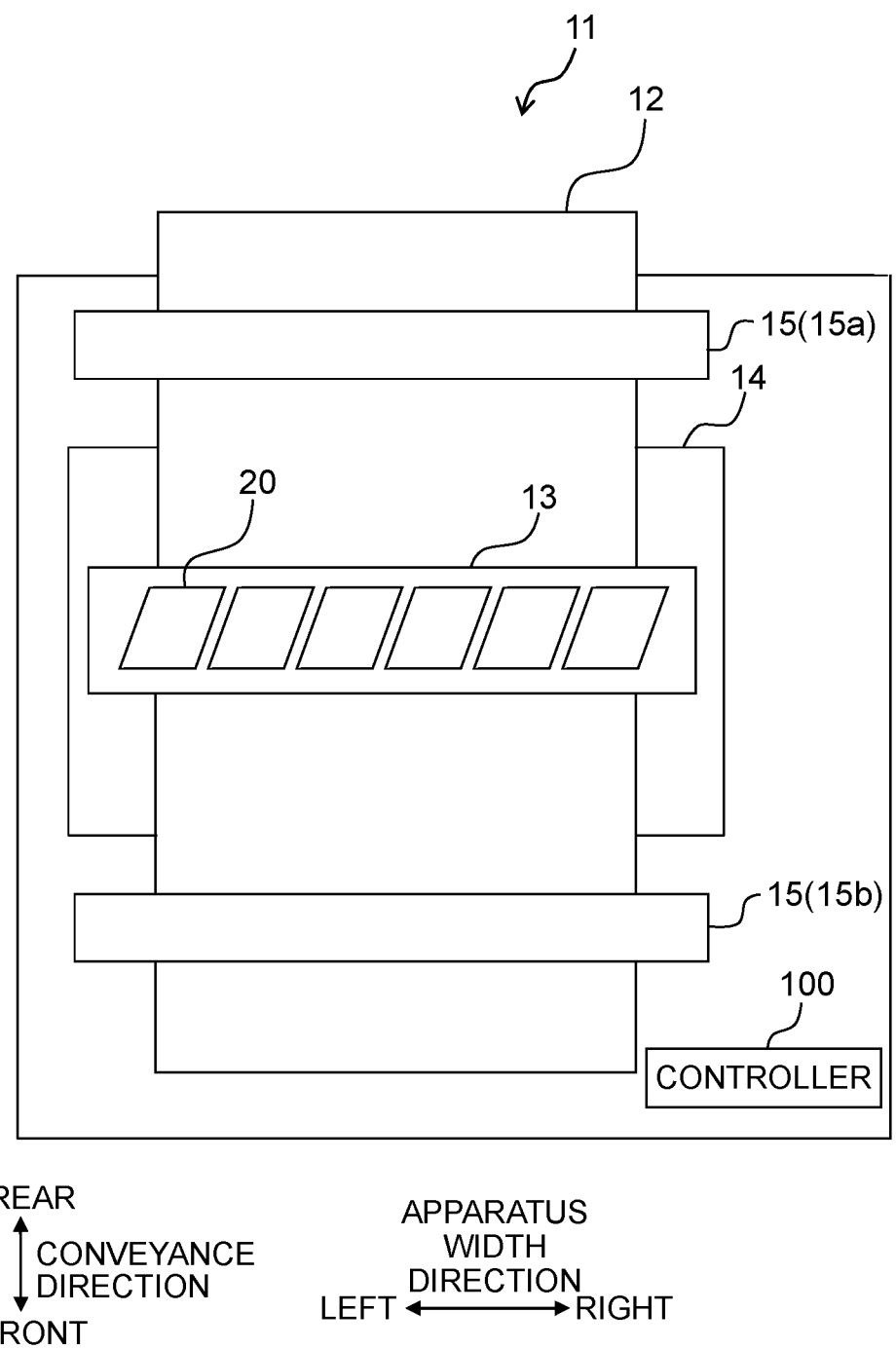
FIG. 1 is a schematic plan view of a printer (ink-jet printer) according to a first embodiment of the present disclosure.

An explanation will be given about the overall configuration of an ink-jet printer 11 (hereinafter referred to as "printer 11") according to an embodiment of the present disclosure, with reference to FIG. 1. The printer 11 is an example of a "liquid discharging apparatus" of the present disclosure. Note that the embodiment which will be explained below is merely an example of the present disclosure, and the embodiment of the present disclosure can be changed or modified as appropriate, in a range not changing the gist of the present disclosure. FIG. 1 depicts a state that the printer 11 is placed on a horizontal plane. In the following description, a side in front of the sheet surface of FIG. 1 is referred to as "upper side" of the printer 11, and a side beyond (far side of) the sheet surface of FIG. 1 is referred to as "lower side" of the printer 11. Further, a front-rear direction and left-right direction depicted in FIG. 1 are defined as a conveyance direction and an apparatus width direction, respectively. The horizontal plane is an example of a "predetermined plane". The conveyance direction is an example of a "second direction" and a "predetermined direction" of the present disclosure. The apparatus width direction is an example of a "first direction" and an example of an "orthogonal direction" of the present disclosure. The following explanation will be given while appropriately using the directional terms which are the front-rear, left-right and up-down (directions).

Figure 3:
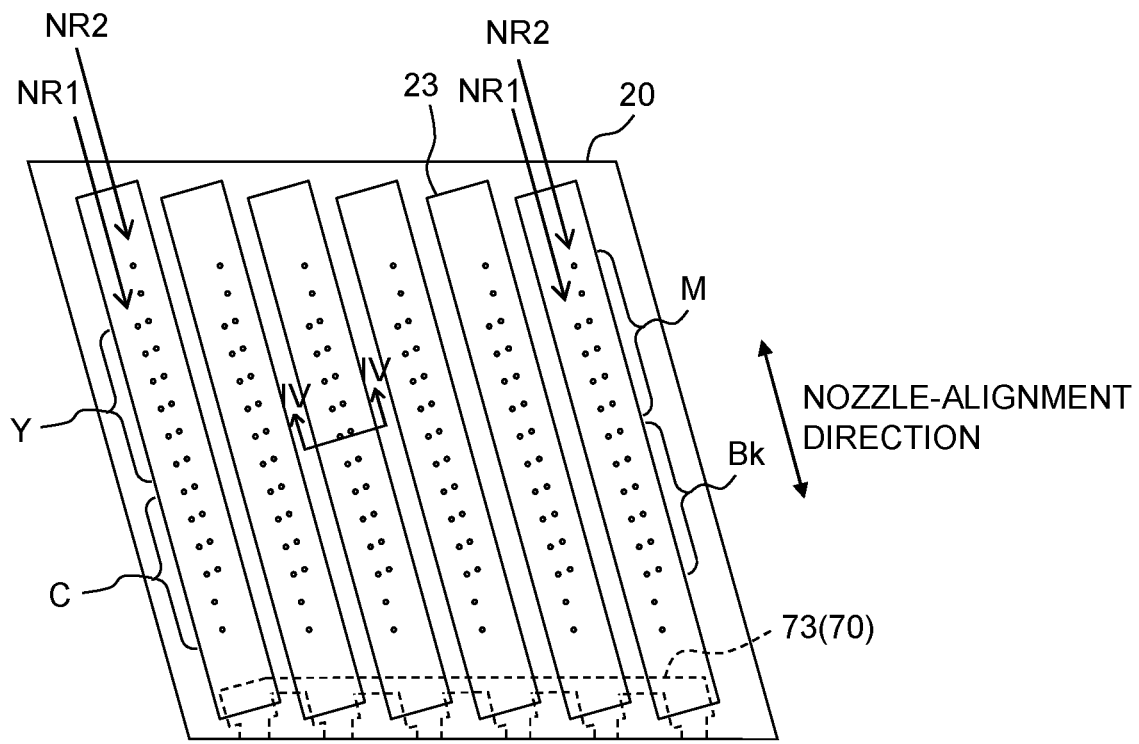
FIG. 3 is a view depicting a bottom surface of a head unit attached to a line head.

As depicted in FIG. 1, the printer 11 is mainly provided with a line head 13, a platen 14, a conveying mechanism 15, a controller 100, etc. The line head 13 has a plurality of head units 20 which are arranged along the apparatus width direction. Note that the line head 13 of the present embodiment has six pieces of the head unit 20. The plurality of head units 20 have a same configuration. As depicted in FIG. 3, each of the head units 20 has a plurality of head modules 23. Each of the head modules 23 is an example of a "liquid discharging module". A plurality of nozzles N are open in the lower surface of each of the head modules 23. As depicted in FIG. 3, the plurality of nozzle N are aligned in a nozzle-alignment direction which crosses the conveyance direction and the apparatus width direction. The nozzle-alignment direction is an example of a "fourth direction" of the present disclosure. The specific of the head unit 20 will be described later on.

The platen 14 is a stand or base on which a recording medium 12 is placed, and is arranged to face the lower surfaces of the respective head modules 23. The conveying mechanism 15 has two conveying rollers 15a, 15b which are arranged so as to sandwich the platen 14 in the conveyance direction therebetween, and a conveying motor 15c (see FIG. 2). Two conveying rollers 15a, 15b are driven while being synchronized with each other by the conveying motor 15c. The conveying mechanism 15 conveys the recording medium 12, placed on the platen 14, in the conveyance direction by the two conveying rollers 15a, 15b.

Figure 2:
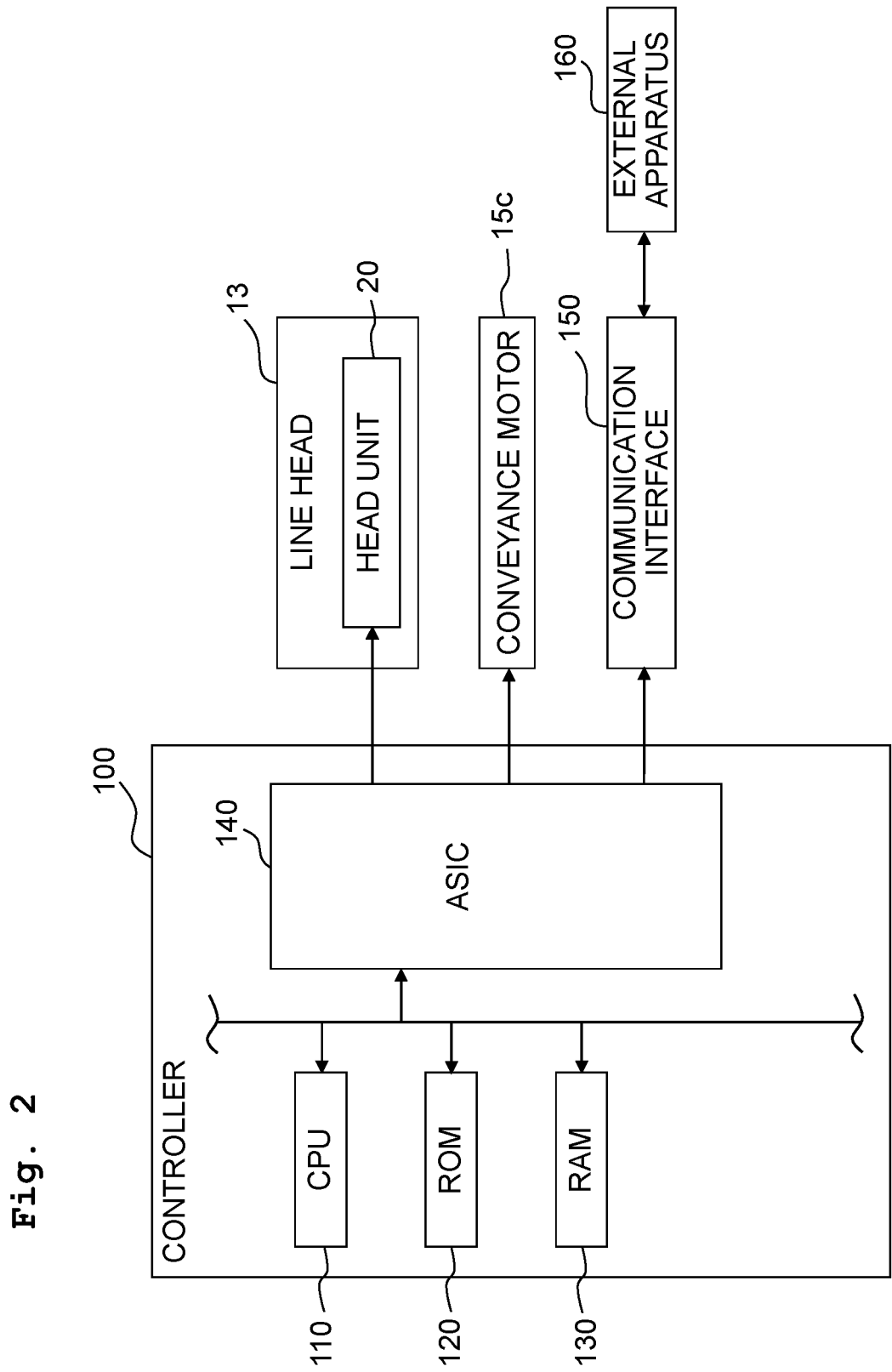
FIG. 2 is a block diagram depicting the electrical configuration of the ink-jet printer.

The controller 100 includes a CPU (Central Processing Unit) 110, a ROM (Read Only Memory) 120, a RAM (Random Access Memory) 130, an ASIC (Application Specific Integrated Circuit) 140, etc., as depicted in FIG. 2. The ROM 120 stores programs executable by the CPU 110, a variety of kinds of fixed data, etc. The RAM 130 temporality stores data necessary for executing the program(s) (such as print data, etc.). The ASIC 140 is connected to various devices (units, components) or driving parts, etc., of the printer 11 such as the line head 13, the conveying motor 15c, etc. Further, the ASIC 140 is connected to an external apparatus 160 such as a PC (Personal Computer) via a communication interface 150.

The controller 100 controls the head units 20 of the line head 13, the conveying motor 15c, etc., based on a printing instruction or command received from the external apparatus 160 to thereby execute a printing processing of printing an image, etc., on a recording medium 12. While executing the printing processing, the controller 100 supplies, to the head units 20, an electric signal for causing the line head 13 to discharge or jet an ink therefrom. Note that the controller 100 and the head units 20 are electrically connected to each other by a flexible wiring board 70 (see FIG. 3) via which the electric signal is transmitted. Note that the flexible wiring board 70 is an exemplary wiring member of the present teaching, and the wiring member of the present teaching may include a flexible base material and wirings formed in the base material such as a flexible printed circuit (FPC), a chip on film (COF), and the like.

In the above explanation, although the variety of kinds of processing executed by the controller 100 is explained as being executed by the CPU 110, it is allowable that the CPU 110 execute these processings in cooperation with the ASIC 140. Further, it is also allowable that the controller 100 is provided with a plurality of pieces of the CPU 110 and that these CPUs 110 perform the processings in a sharing manner. Furthermore, it is also allowable that the controller 100 is provided with a plurality of pieces of the ASICs 140 and that these ASICs 140 execute the processings in a shared manner. Alternatively, it is allowable that only one piece of the ASIC 140 singly performs the processings.

<Head Unit 20>

As depicted in FIG. 3, each of the head units 20 has an outer shape that is parallelogram constructed of a pair of opposite sides parallel to the apparatus width direction, and a pair of opposite sides parallel to the nozzle-alignment direction. Each of the head units 20 has six pieces of the head module 23 which are arranged side by side to one another along the apparatus width direction. Each of the six head modules 23 extends in the nozzle-alignment direction. Each of the six head modules 23 have a same configuration, and electric signals corresponding to the six head modules 23, respectively, are transmitted to the six head modules 23, respectively, via one piece of the flexible wiring board 70.

<Head Module 23>

As depicted in FIG. 3, the plurality of nozzles N via which the ink is discharged is formed in the bottom surface of each of the head modules 23. The plurality of nozzles N form two nozzle rows which are nozzle rows NR1, NR2 which are arranged side by side to each other in an orthogonal direction orthogonal to the nozzle-alignment direction; each of the nozzle rows are formed along the nozzle-alignment direction. The two nozzle rows NR1, NR2 are formed in such a state that the positions thereof in the nozzle-alignment direction are shifted from each other. Note that the two nozzle rows NR1, NR2 are formed of a same number of the nozzles, and that the plurality of nozzles N are formed with equal intervals (spacing distances) therebetween in each of the nozzle rows. Further, the present embodiment is configured such that two kinds of inks are discharged from each of the two nozzle rows, namely such that four kinds of inks are discharged from the two nozzle rows. For example, the present embodiment is configured such that an yellow ink Y and a cyan ink C are discharged from the nozzle row NR1, and a magenta ink M and a black ink Bk are discharged from the nozzle row NR2.

Figure 4:
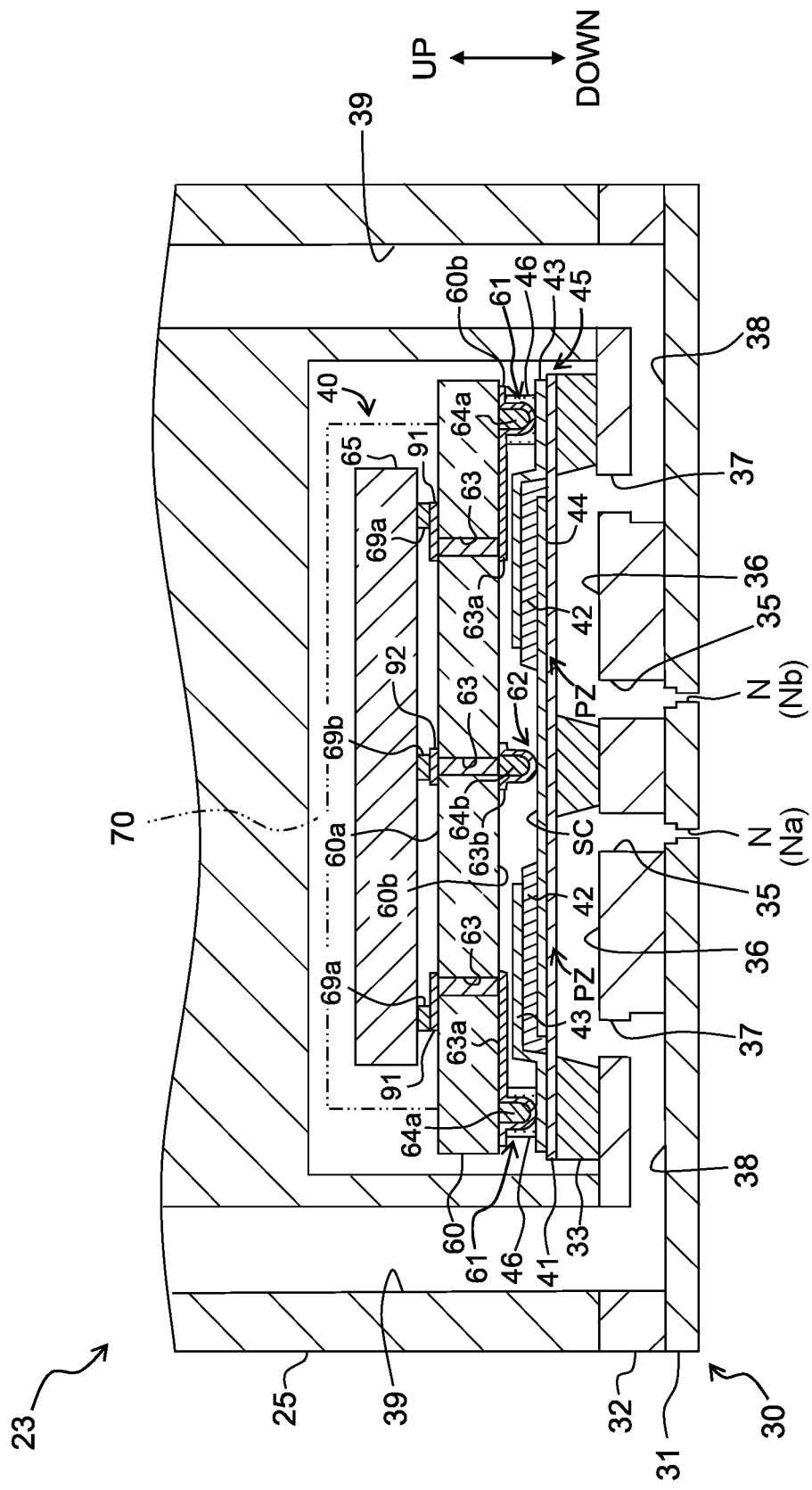
FIG. 4 is a cross-sectional view of FIG. 3, taken along a line IV-IV in FIG. 3.

As depicted in FIG. 4, the head module 23 has a channel unit 30 forming a flow channel (channel) for the ink; a liquid discharging head 40 causing the ink to be discharged from the nozzles N; and a module case 25. The channel unit 30 and the liquid discharging head 40 are attached to the module case 25 in a state that the channel unit 30 and the liquid discharging head 40 are stacked in the up-down direction.

The channel unit 30 is provided with, starting from the lower side thereof: a nozzle plate 31 formed with the plurality of nozzles N; a channel substrate 32; a pressure chamber substrate 33; and a vibration plate 41. The nozzle plate 31, the channel substrate 32, the pressure chamber substrate 33 and the vibration plate 41 are fixed to one another while being staked on top of one another. The channel unit 30 is formed with: descenders 35 communicating with the nozzles N, respectively; pressure chambers 36 communicating with the descenders 35, respectively; liquid supplying channels 37 communicating with the pressure chambers 36, respectively; and a common liquid chamber 38 communicating with the liquid supplying channels 37. Among those as described above, each of the descenders 35, each of the pressure chambers 36 and each of the liquid supplying channels 37 are formed to correspond to one of the nozzles N. In contrast, one piece of the head module 23 is formed with four pieces of the common liquid chamber 38 corresponding to the four kinds of inks, respectively, and each of the common liquid chambers 38 are communicated with nozzles N from which a same kind of the ink is discharged.

The module case 25 is a member which is substantially box-shaped. A liquid introducing path 39, configured to introduce an ink from a non-illustrated ink supply source to the common liquid chamber 38 in the channel unit 30 is formed in the inside of the module case 25. The liquid introducing path 39, together with the common liquid chamber 38, is a space in which an ink common to a plurality of pieces of the pressure chamber 36 formed to be aligned in the channel unit 30 is stored. In the present embodiment, four pieces of the liquid introducing path 39 are formed corresponding to the four kinds of the ink, respectively.

The liquid discharging head 40 is provided with, starting from the lower side thereof: the vibration plate 41 formed with piezoelectric elements PZ; a wiring circuit board (wiring substrate) 60, and a driver IC 65 which outputs a predetermined output voltage. Namely, the wiring substrate 60 has a first surface 60a facing (opposite to) the driver IC 65 and a second surface 60b facing the vibration plate 41.

The vibration plate 41 is a plate-shaped member which is capable of elastically vibrating. The lower surface of the vibration plate 41 constructs the pressure chambers 36 of the channel unit 30, and the upper surface of the vibration plate 41 has the plurality of piezoelectric elements PZ which are formed therein and which correspond to the plurality of nozzles N, respectively. Each of the piezoelectric elements PZ has a piezoelectric body 42 which expands and contracts in a case that an electric field acts thereon, and first and second electrodes 43 and 44 which are arranged to sandwich, in the up-down direction, the piezoelectric body 42 therebetween. The first electrode 43 is an individual electrode which is formed on the upper surface of the piezoelectric body 42, corresponding to each of the pressure chambers 36 (each of the nozzles N). The second electrode 44 is an electrode which is formed on the upper surface of the vibration plate 41 corresponding to the plurality of pressure chambers 36 (plurality of nozzles N), and which is common to the plurality of piezoelectric elements PZ. In a case that a voltage is applied to the first and second electrodes 43 and 44 and that the electric field acts on a certain part or portion, of the piezoelectric body 42, sandwiched by the first and second electrodes 43 and 44, the certain part, of the piezoelectric body 44, is deformed so as to project toward a certain pressure chamber 36 included in the plurality of pressure chambers 36 and corresponding to the certain part. This causes the vibration plate 41 to be curbed or bent, thereby imparting pressure (pressurizing) the ink inside the certain pressure chamber 36. In this situation, the ink is discharged from a certain nozzle N included in the plurality of nozzles N and corresponding to the certain pressure chamber 36. Note that in this case, the vibration plate 41 formed with the piezoelectric elements PZ is referred to as a piezoelectric-element formation substrate 45.

The first surface 60a of the wiring substrate 60 is formed with a plurality of first output terminals 91 and a plurality of second output terminals 92. The plurality of first and second output terminals 91 and 92 are electrically connected to the driver IC 65, and an output voltage outputted from the driver IC 65 is transmitted to the plurality of first and second output terminals 91 and 92. Namely, an electric circuit configured to selectively supply the output voltage with respect to the plurality of piezoelectric elements PZ, etc., are provided or mounted on the driver IC 65, and bumps 69a and bumps 69b are formed on an active surface, of the driver IC 65, which is a circuit formation surface. Further, the driver IC 65 is electrically connected to the first output terminals 91 by the bumps 69a, and is electrically connected to the second output terminals 92 by the bumps 69b. Namely, the driver IC 65 is attached to the first surface 60a of the wiring substrate 60 by means of a so-called Flip Chip mounting or packaging.

Furthermore, the wiring substrate 60 is formed with a plurality of through wirings 63 each of which is electrically connected either one of the first output terminals 91 and the second putout terminals 92. Moreover, the second surface 60b of the wiring substrate 60 is formed with connecting wirings 63a and connecting wirings 63b electrically connected to the plurality of through wirings 63, respectively. Namely, the first output terminals 91 and the second output terminals 92 formed on a side of the first surface 60a of the wiring substrate 60 are electrically connected to the connecting wirings 63a the connecting wirings 63b, respectively, which are provided on a side of the second surface 60b of the wiring substrate 60.

Further, the second surface 60b of the wiring substrate 60 is formed with first conductive terminals 61 and second conductive terminals 62 each of which is electrically connected to the piezoelectric-element formation substrate 45. In the present embodiment, the first conductive terminals 61 are each a resin bump which is constructed of an inner resin 64a and a connecting wiring 63a formed so as to cover the inner resin 64a therewith. Further, the second conductive terminals 62 are each a resin bump which is constructed of an inner resin 64b and a connecting wiring 63b formed so as to cover the inner resin 64b therewith. Namely, the output voltage outputted from the driver IC 65 is transmitted to the first conductive terminals 61 provided on the side of the second surface 60b of the wiring substrate 60, and is also transmitted to the second conductive terminals 62 provided on the side of the second surface 60b of the wiring substrate 60. Further, the output voltage transmitted to the first conducting terminals 61 is supplied to the first electrodes 43 of the piezoelectric-element formation substrate 45, and the output voltage transmitted to the second conducting terminals 62 is supplied to the second electrode 44 of the piezoelectric-element formation substrate 45, thereby causing the ink to be discharged from each of the nozzles N.

Further, the first and second conductive terminals 61 and 62 forms, in the liquid discharging head 40, a gap having a predetermined size (dimension) between the piezoelectric-element formation substrate 45 and the wiring substrate 60 facing the piezoelectric-element formation substrate 45. Namely, the first and second conductive terminals 61 and 62, each provided as the plurality of conductive terminals, form the gap between the piezoelectric-element formation substrate 45 and the wiring substrate 60 such that the vibration plate 41 which deforms in the up-down direction does not make contact with the wiring substrate 60.

Note that after the plurality of first conductive terminals 61 are connected between the piezoelectric-element formation substrate 45 and the wiring substrate 60, it is allowable to fill a sealing member 46 formed of a resin in a space between the piezoelectric-element formation substrate 45 and the wiring substrate 60 and between first conductive terminals 61 which are adjacent to each other. By doing so, a space surrounded by the piezoelectric-element formation substrate 45, the wiring substrate 60, the first conductive terminals 61 and the sealing member 46 forms a sealed space SC in which the piezoelectric elements PZ are sealed (see FIG. 4). In this meaning, the wiring substrate 60 is also a sealing substrate sealing the piezoelectric elements PZ therein.

Figure 5:
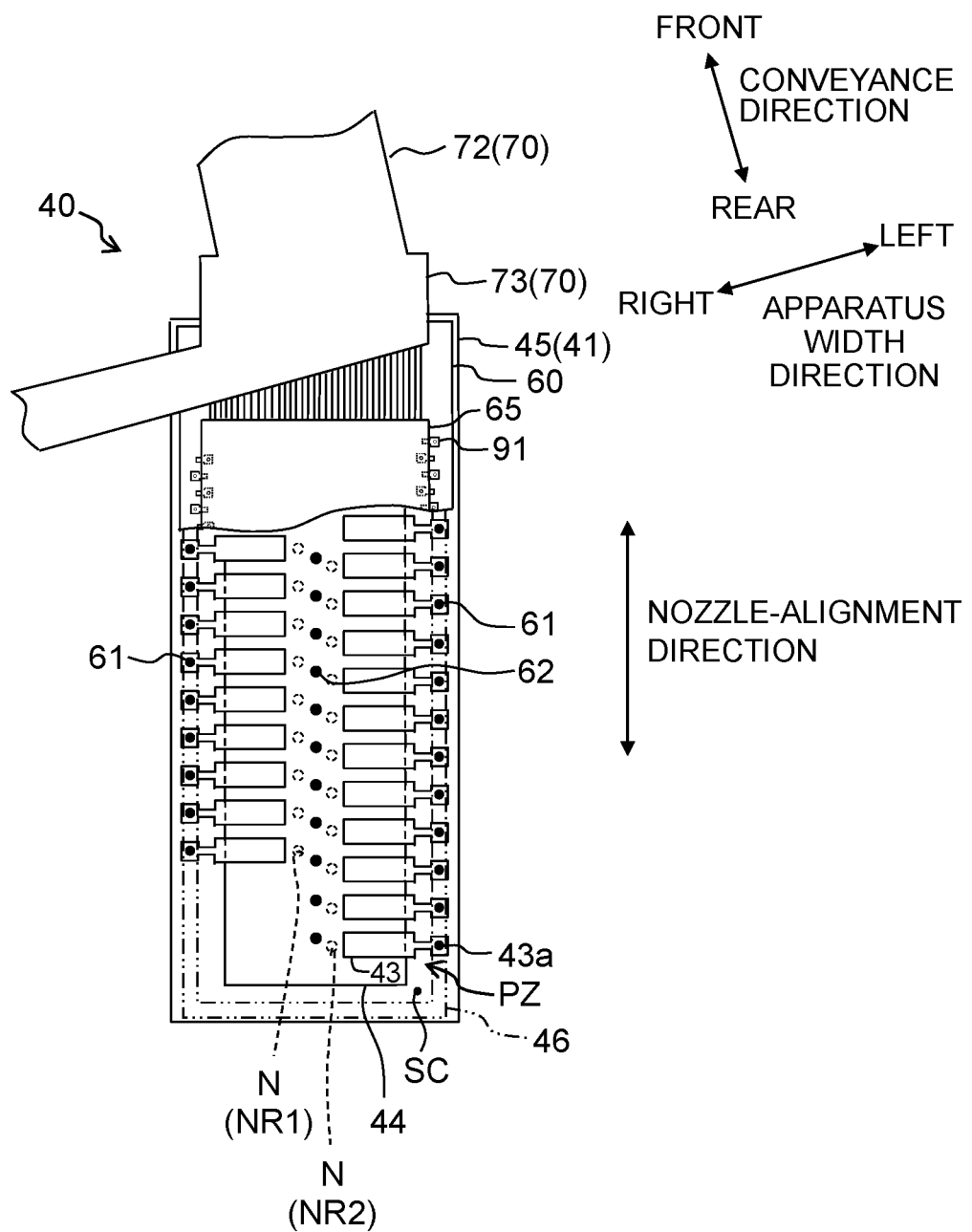
FIG. 5 is a view depicting the configuration of a liquid discharging head in a plan view, in a state that piezoelectric elements are exposed by depicting a wiring board and a driver IC in a broken manner.

Next, an explanation will be given about the configuration of the liquid discharging head 40, with reference to FIG. 5. Note that the piezoelectric body 42 is omitted in the illustration of FIG. 5. As depicted in FIG. 5, the plurality of first electrodes 43 form, in the piezoelectric-element formation substrate 45, an electrode row aligned in the nozzle-alignment direction so as to correspond to the nozzles N in the nozzle row NR1, respectively, and an electrode row aligned in the nozzle-alignment direction so as to correspond to the nozzles N in the nozzle row NR2, respectively.

The first electrodes 43 are formed with projecting electrodes 43a, respectively, each of which projects toward the outer circumference of the piezoelectric-element formation substrate 45. The plurality of first conductive terminals 61 which are arranged along the nozzle-alignment direction are connected with respect to the projecting electrode 43a, respectively, as depicted as black (solid) circles in FIG. 5. Further, the plurality of second conductive terminals 62 are arranged along the nozzle-alignment direction, and are connected with respect to the second electrode 44 of the piezoelectric elements PZ, as depicted as black (solid) circles in FIG. 5.

In the liquid discharging head 40 of the present embodiment, the electric signal transmitted from the controller 100 via the flexible wiring board 70 is inputted to the wiring substrate 60. Further, the driver IC 65 outputs a predetermined output voltage (driving voltage), based on the electric signal inputted to the wiring substrate 60.

Next, an explanation will be given about the electric signal transmitted from the controller 100 via the flexible wiring board 70 and the output voltage outputted from the driver IC 65, with reference to FIG. 6. Note that in the present embodiment, in the six head modules 23 aligned in the head unit 20, the generation of the electric signal transmitted via the flexible wiring board 70 and the generation of the output voltage outputted to the piezoelectric elements PZ are performed with a similar circuit configuration. Accordingly, the explanation will be given about one piece among the six head modules 23, as follows.

Figure 6:
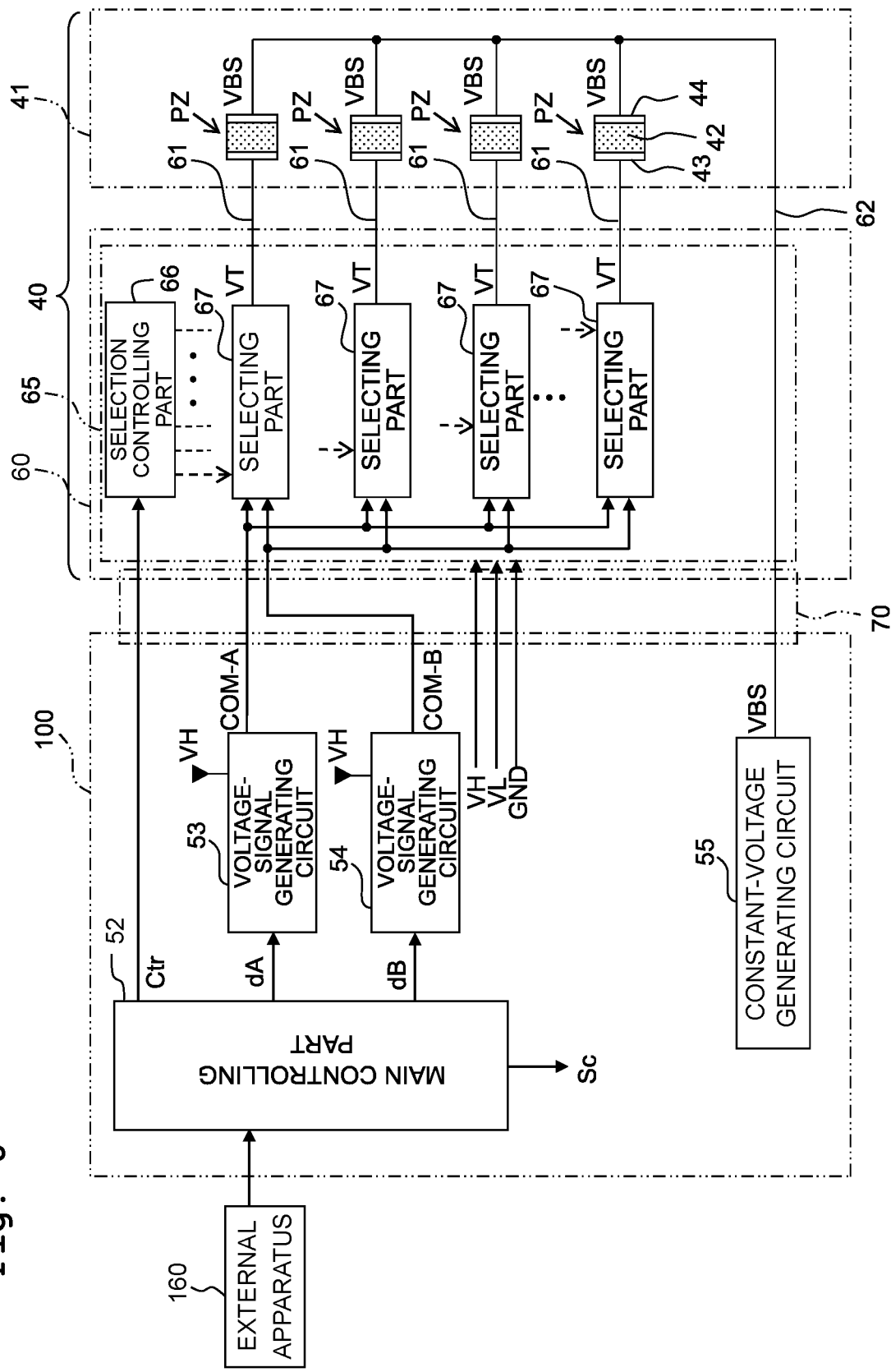
FIG. 6 is a circuit block diagram depicting the configuration of a circuit from which a driving signal for driving the piezoelectric elements is outputted to the piezoelectric elements.

As depicted in FIG. 6, the controller 100 is provided with a main controlling part 52, two voltage-signal generating circuits 53, 54, and a constant-voltage generating circuit 55. Further, an electric circuit configured to output a driving voltage VT to the first electrode 43 of each of the piezoelectric elements PZ and to output a constant voltage VBS to the second electrode 44 is constructed in the driver IC 65 possessed by the liquid discharging head 40.

The main controlling part 52 outputs a variety of kinds of control signals, etc., for controlling the voltage-signal generating circuits 53, 54 and the electric circuit of the driver IC 65 in a case that an image data as an object (target) of printing is supplied from the external apparatus 160 such as the PC, etc. Specifically, the main controlling part 52 repeatedly supplies digital data dA to the voltage-signal generating circuit 53 as one of the voltage-signal generating circuits 53, 54; and the main controlling part 52 repeatedly supplies digital data dB to the voltage-signal generating circuit 54 as the other of the voltage-signal generating circuits 53, 54. Here, the data dA defines the signal wave form of a first voltage signal which is an electric signal transmitted to the liquid discharging head 40, and the data dB defines the signal wave form of a second voltage signal which is an electric signal transmitted to the liquid discharging head 40.

After the voltage-signal generating circuit 53 as one of the voltage-signal generating circuits 53, 54 converts the data dA repeatedly supplied thereto into an analogue voltage, the voltage-signal generating circuit 53 outputs the first voltage signal, which is an analogue signal amplified for example by the class D amplification, to the liquid discharging head 40 as a driving signal COM-A. Similarly, after the voltage-signal generating circuit 54 as the other of the voltage-signal generating circuits 53, 54 converts the data dB repeatedly supplied thereto into an analogue voltage, the voltage-signal generating circuit 54 supplies the second voltage signal, which is an analogue signal amplified for example by the class D amplification, to the liquid discharging head 40 as a driving signal COM-B. Note that the two voltage-signal generating circuits 53, 54 have a similar circuit configuration except for being mutually different in the data inputted thereto and in the signal waveform of the voltage signal outputted therefrom; a constant voltage VH is used as the power source for the voltage-signal generating circuits 53, 54.

Further, the main controlling part 52 outputs a control signal Sc for controlling the driving of the conveying motor 15c and controlling the conveyance of the recording medium 12; and the main controlling part 52 supplies, synchronizing with the control signal Sc, a variety of kinds of a control signal Ctr to the liquid discharging head 40, as electric signals. Note that the control signal Ctr supplied to the liquid discharging head 40 is a digital (binary) voltage signal. In the present embodiment, the control signal Ctr includes a print data defining an ink amount of the ink to be discharged from the nozzle N, a clock signal used for transmitting the print data, a timing signal defining the print cycle, etc.

Furthermore, in addition to the driving signals COM-A, COM-B and the controlling signal Ctr, the constant voltage VBS generated by the constant-voltage generating circuit 55 is supplied from the controller 100 via the flexible wiring board 70. Moreover, a voltage VH which is a constant potential as a power source for allowing the electric circuit of the driver IC 65 to operate, a voltage VL which is a constant potential and lower than the voltage VH, and a ground voltage GND (0 (zero) V) which is a constant potential and serves as the reference for the respective voltages, are supplied from the controller 100 via the flexible wiring board 70. In other words, the voltage VH, the voltage VL and the ground voltage GND (0 V) which are the constant potentials, respectively, are supplied via the flexible wiring board 70 each as a constant-potential signal.

Figure 7:
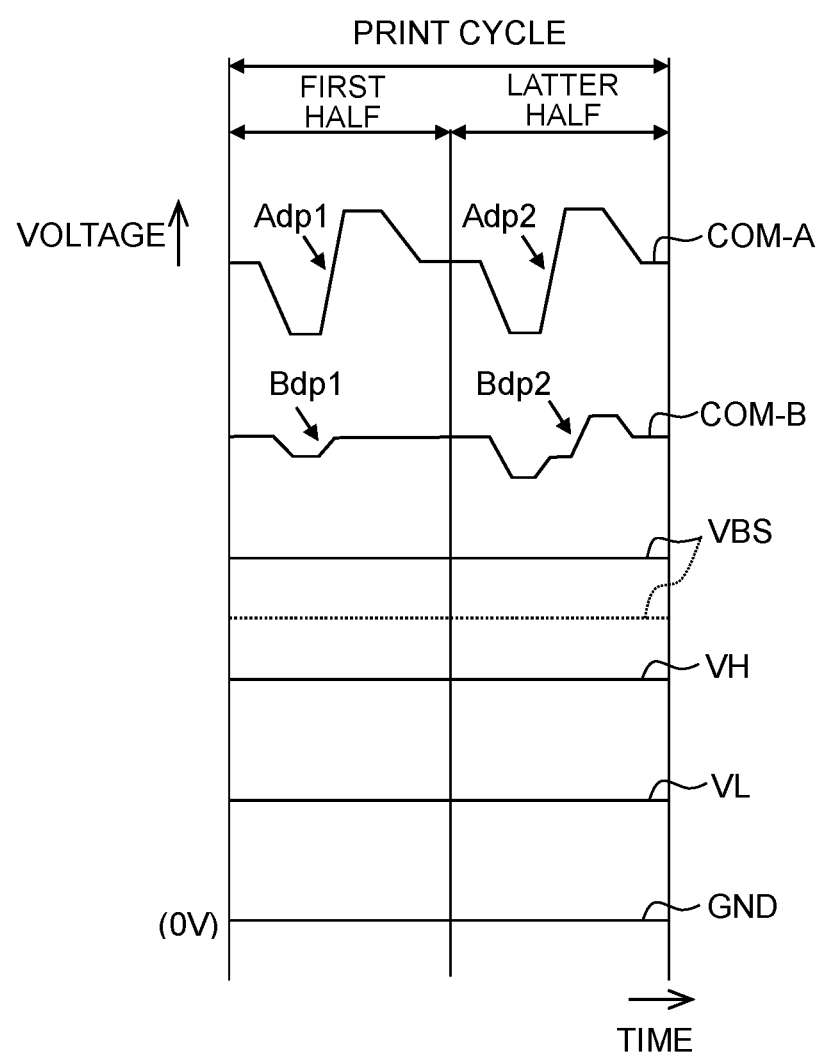
FIG. 7 is a wave-form chart of a voltage signal inputted to the wiring board.

As depicted in FIG. 7, the driving signal COM-A in the present embodiment has a signal wave form wherein a trapezoidal wave form Adp1 which is arranged at a first half period in the print cycle, and a trapezoidal wave form Adp2 which is arranged at a latter half period in the print cycle are made to be continuous. The trapezoidal wave form Adp1 and the trapezoidal wave form Adp2 have a substantially same wave form; in a case that either one of the trapezoidal wave form Adp1 and the trapezoidal wave form Adp2 is supplied to the first electrode 43 of a certain piezoelectric element PZ included in the plurality of the piezoelectric elements PZ, each of the trapezoidal wave form Adp1 and the trapezoidal wave form Adp2 indicates a change in the voltage by which an intermediate amount of the ink is discharged from a nozzle N included in the plurality of the nozzles N and corresponding to the certain piezoelectric element PZ.

Further, the driving signal COM-B in the present embodiment has a signal wave form wherein a trapezoidal wave form Bdp1 which is arranged at a first half period in the print cycle, and a trapezoidal wave form Bdp2 which is arranged at a latter half period in the print cycle are made to be continuous. The trapezoidal wave form Bdp1 and the trapezoidal wave form Bdp2 have mutually different wave forms. Among the trapezoidal wave form Bdp1 and the trapezoidal wave form Bdp2, the trapezoidal wave form Bdp1 is a wave form for finely vibrating the ink in the vicinity of the nozzle N to thereby prevent any increase in the viscosity of the ink. Namely, in a case that the trapezoidal wave form Bdp1 is supplied to the first electrode 43 of a certain piezoelectric element PZ included in the plurality of the piezoelectric elements PZ, the trapezoidal wave form Bdp1 indicates a change in the voltage by which the ink is not discharged from a nozzle N included in the plurality of the nozzles N and corresponding to the certain piezoelectric element PZ. Further, in a case that the trapezoidal wave form Bdp2 is supplied to the first electrode 43 of a certain piezoelectric element PZ included in the plurality of the piezoelectric elements PZ, the trapezoidal wave form Bdp2 indicates a change in the voltage by which a small amount of the ink is discharged from a nozzle N included in the plurality of the nozzles N and corresponding to the certain piezoelectric element PZ, the small amount of the ink being smaller than the intermediate amount of the ink which is discharged in the case of applying the trapezoidal wave form Adp1 or the trapezoidal wave form Adp2 to the first electrode 43.

On the other hand, the other constant voltages which are the voltage VBS, the voltage VH, the voltage VL and the ground voltage GND are each such a constant voltage of which voltage value is not changed (varied) or of which change is slight or small, during the print cycle. Note that the constant voltage VBS may be generated, for example as indicated by broken lines in FIG. 7, such that the voltage value thereof is changed with one print cycle as an unit period. Further, the voltage VH or the voltage VL may be generated by the constant-voltage generating circuit 55.

Returning to FIG. 6, the driver IC 65 provided on the liquid discharging head 40 has a selection controlling part 66 and selecting parts 67 which correspond to the plurality of piezoelectric elements PZ, respectively, in one-to-one manner, as an electric circuit configured to supply the voltage selectively to the plurality of piezoelectric elements PZ. Namely, the driver IC 65 outputs the driving signal COM-A and the driving signal COM-B, which are transmitted from the controller 100 via the flexible wiring board 70, selectively to the first electrode 43 of a piezoelectric element PZ among the plurality of piezoelectric elements PZ.

Specifically, the selection controlling part 66 once stores the clock signal transmitted from the controller 100 via the flexible wiring board 70 and the print data transmitted from the controller 100 via the flexible wiring board 70 while being synchronized with the clock signal, by a number same as the number of the nozzles N (piezoelectric elements PZ) of the head unit 20. Then, according to the stored print data, the selection controlling part 66 instructs each of the selecting parts 67 to perform the selection between the driving signal COM-A and the driving signal COM-B, at a start timing of the print cycle (first half period, latter half period) which is defined by the timing signal transmitted from the controller 100 via the flexible wiring board 70. Each of the selecting parts 67 selects either one (or selects none) of the driving signals COM-A and COM-B, and outputs the selected one of the driving signals COM-A and COM-B (or outputs non-selection of either one of the driving signals COM-A and COM-B) to the first electrode 43 via the first conductive terminal 61, as the driving voltage VT to be applied to the piezoelectric element PZ corresponding thereto.

Further, the driver IC 65 outputs a constant voltage to the second electrode 44 of each of the piezoelectric elements PZ. Namely, in the present embodiment, the constant voltage VBS transmitted from the controller 100 via the flexible wiring board 70 is inputted to the driver IC 65 via the wiring substrate 60. Afterwards, the inputted constant voltage VBS is outputted with respect to the second electrode 44 common to the plurality of piezoelectric elements PZ of the liquid discharging head 40, from the driver IC 65 again via the second conductive terminals 62 provided on the wiring substrate 60.

In the above-described manner, the driving voltage VT is outputted from the driver IC 65 selectively to respective one of the plurality of piezoelectric elements PZ, thereby applying the driving voltage VT selectively to the first electrodes 43 of the respective piezoelectric elements PZ, and applying the constant voltage VBS to the second electrode 44 (which is common to the plurality of piezoelectric elements PZ). As a result, any expansion and contraction according to the potential difference (difference in the potentials) between the driving voltage VT and the constant voltage VBS is generated in certain piezoelectric elements PZ which are included in the plurality of piezoelectric elements PZ and to which the driving voltage VT is selectively applied, and the ink is discharged from certain nozzles N which are included in the plurality of nozzles N and which correspond to the certain piezoelectric elements PZ, accompanying with the above-described expansion and contraction. Then, dots of different sizes are formed on the paper P depending on the amounts of the discharged ink(s). Therefore, the constant voltage VBS may also be considered as one of the driving signals.

<Flexible Wiring Board 70>

Figure 8:
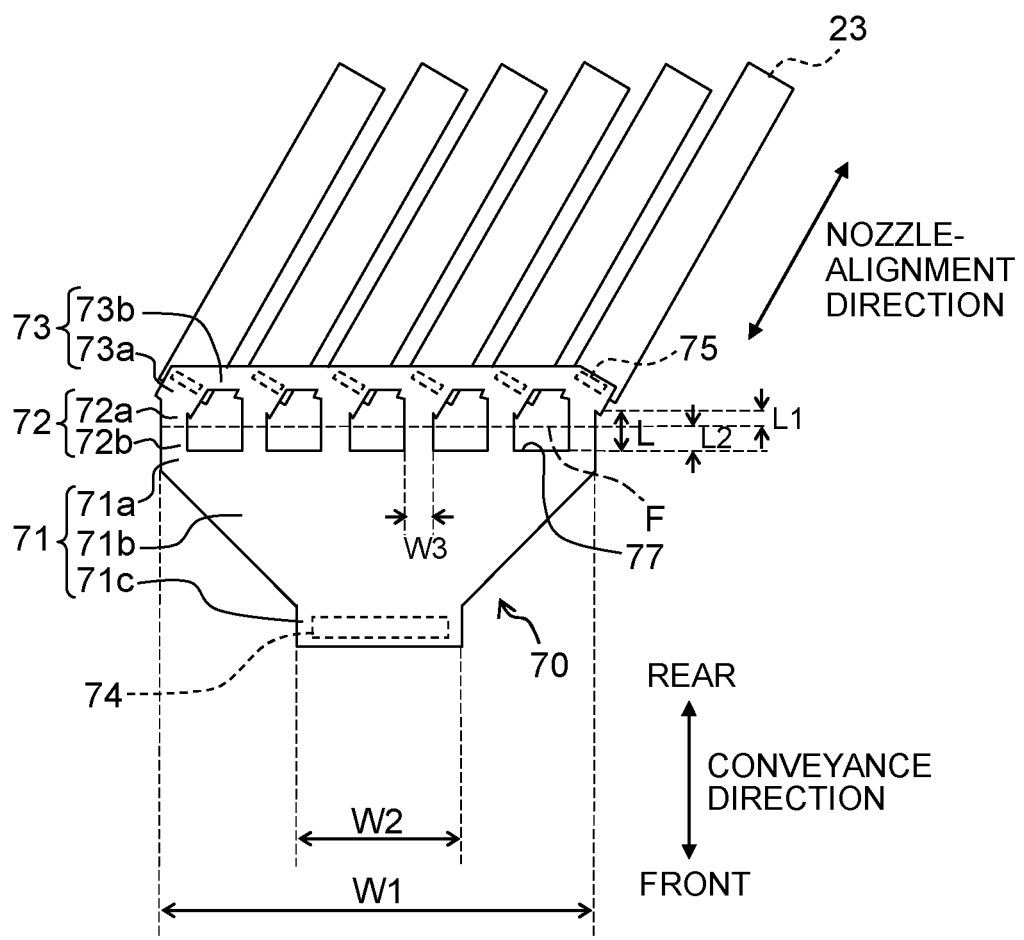
FIG. 8 is a plan view depicting the planar shape of a flexible wiring board before being bent.

Next, an explanation will be given about the flexible wiring board 70 of the present embodiment. Firstly, the planar shape of the flexible wiring board 70 will be explained, with reference to FIG. 8. In a state depicted in FIG. 8 before the flexible wiring board 70 is bent, the flexible wiring board 70 has a sixth part 71, six second parts 72 branched from the sixth part 71, and an eighth part 73 connecting or linking the ends of the six second parts 72 with one another. In other words, five through holes 77 defined by the sixth part 71, the six second parts 72 and the eighth part 73 are formed in the flexible wiring board 70.

The sixth part 71 is constructed of a wide-width part 71a, a tapered part 71b and a narrow-width part 71c. Width W1 in the apparatus width direction of the wide-width part 71a is greater than width W2 in the apparatus width direction of the narrow-width part 71c. Further, the width in the apparatus width direction of the tapered part 71b is made to be progressively smaller (tapered) from the wide-width part 71a toward the narrow-width part 71c. An input terminal 74 connectable to a connector of the controller 100 is arranged at the narrow-width part 71c.

The six second parts 72 correspond to the six head modules 23, respectively, and extend in the conveyance direction. Width W3 in the apparatus width direction of each of the second parts 72 is smaller than the width W1 of the wide-width part, and is smaller than the width W2 of the narrow-width part. Namely, the width W3 in the apparatus width direction of each of the second parts 72 is smaller than the width in the apparatus width direction of the sixth part 71. Each of the second parts 72 is constructed of a first part 72a on a side of the eighth part 73 relative to a bending line F indicated in broken lines in FIG. 8, and a second part 72b on a side of the sixth part 71 relative to the bending line F. Note that a virtual boundary of each of the first part 72a with respect to the eighth part 73 extends in an orthogonal direction orthogonal to the nozzle-alignment direction. Accordingly, each of the third parts 72a has a trapezoidal shape of which side on the right side in the apparatus width direction is a short side, and of which side on the left side in the apparatus width direction is a long side. In the following explanation, the length of the short side of the first part 72 having the trapezoidal shape is defined as a "length L1 in the conveyance direction of the first part 72a". Further, a sum of the length L1 in the conveyance direction of the first part 72a and length L2 in the conveyance direction of the second part 72b is defined as "length L in the conveyance direction of the branched part 72". In each of the second parts 72 of the present embodiment, the width W3 in the apparatus width direction is smaller than the length L in the conveyance direction.

The eighth part 73 is constructed of first parts 73a which are provided on six locations arranged side by side to one another in the apparatus width direction, and seventh parts 73b which are provided on five locations arranged side by side to one another in the apparatus width direction. Each of the first parts 73a is rectangular-shaped, and extends in the nozzle-alignment direction. One end in the nozzle-alignment direction of each of the first parts 73a is continued to the first part 72a of one of the second parts 72 corresponding thereto. On the other hand, the other end in the nozzle-alignment direction of each of the first parts 73a is provided with a joint area 75. The joint area 75 is an area which is joined to the wiring substrate 60 of the head module 23, and at which an output terminal (to be) jointed to a contact point of the wiring substrate 60 is arranged. Each of the seventh parts 73b is continued to two first parts 73a included in the six first parts 73a and arranged at two locations which are adjacent in the apparatus width direction. In other words, the two first parts 73a arranged at the two locations which are adjacent in the apparatus width direction are linked by each of the seventh parts 73b. The eighth part 73 extending in the apparatus width direction is formed of the first parts 73a provided on the six locations and the seventh parts 73b provided on the five locations.

Next, the arrangement of wirings in the flexible wiring board 70 will be explained with reference to FIG. 9. Firstly, a COM-A wiring 76a configured to transmit the driving signal COM-A therethrough is arranged from the input terminal 74 along the outer shape of the flexible wiring board 70. The COM-A wiring 76a is an example of a "driving-signal wiring" of the present disclosure. Further, similarly to the COM-A wiring 76a, a COM-B wiring 76b configured to transmit the driving signal COM-B therethrough is arranged from the input terminal 74 along the outer shape of the flexible wiring board 70. The COM-B wiring 76b is also an example of the "driving-signal wiring" of the present disclosure. The COM-B wiring 76b is arranged on the inside of the COM-A wiring 76a. Note that each of the COM-A wiring 76a and the COM-B wiring 76b is cut or broken at a central portion in the apparatus width direction of the eighth part 73. With this, a signal from the left side or a signal from the right side is allowed to be inputted into one piece of the joining part 73a, and it is possible to prevent signals from both of the left and right sides from being inputted into one piece of the joining part 73a.

A GND wiring 76c is arranged in an annular shape further on the inside of the COM-B wiring 76b, so as to conform to the outer shape of the flexible wiring circuit 70 and the outer shape of the five through holes 77. Namely, the GND wiring 76c is provided commonly with respect to the six head modules 23. Six V-high wirings 76d, which are drawn from the input terminal 74 respectively toward the first parts 73a arranged at the six locations, are arranged in the inside of an area surrounded by the GND wiring 76c. The constant-potential signal is transmitted to each of the V-high wirings 76d. Note that the GND wiring 76c is drawn from a central portion in the apparatus width direction of each of the first parts 73a up to the input terminal 74, such that the GND wiring 76c is along the V-high wiring 76d drawn from each of the first parts 73a. Further, control wirings 76e which are drawn from the input terminal 74 toward the first parts 73a, respectively, and which are arranged at the six locations, etc., are arranged in the inside of the area surrounded by the GND wiring 76c. The control signal 76e is transmitted to each of the control wirings 76e.

Figure 9:
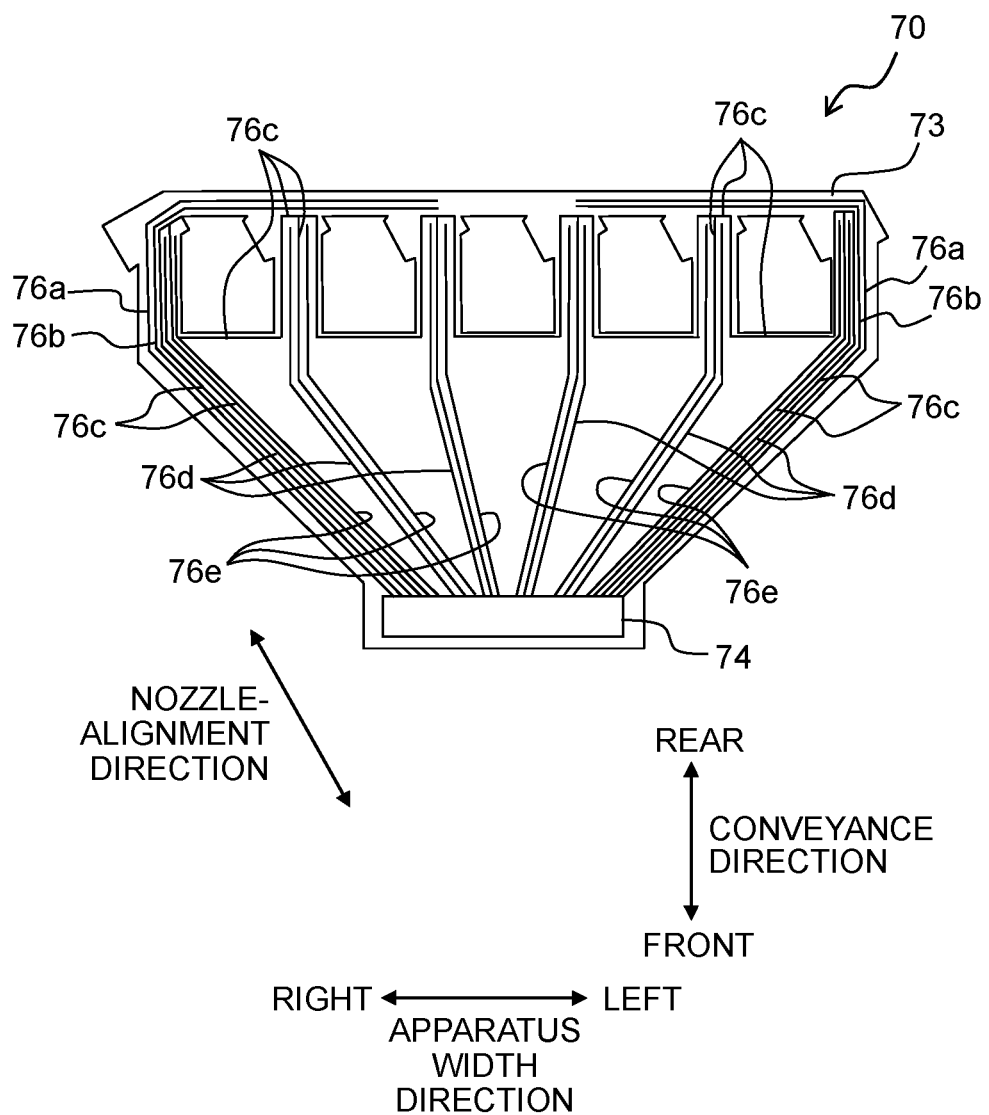
FIG. 9 is a plan view depicting the arrangement of wirings in the flexible wiring board.

By arranging the respective wirings (the variety of kinds of wirings) as depicted in FIG. 9, the GND wiring 76c is arranged along the V-high wirings 76a on one side or on the both sides relative to each of the V-high wirings 76d. With this, it is possible to lower a noise due to the electric current flowing through the V-high wirings 76d and reaching the COM-A signal 76a and/or the COM-B signal 76b, etc.

Figure 10:
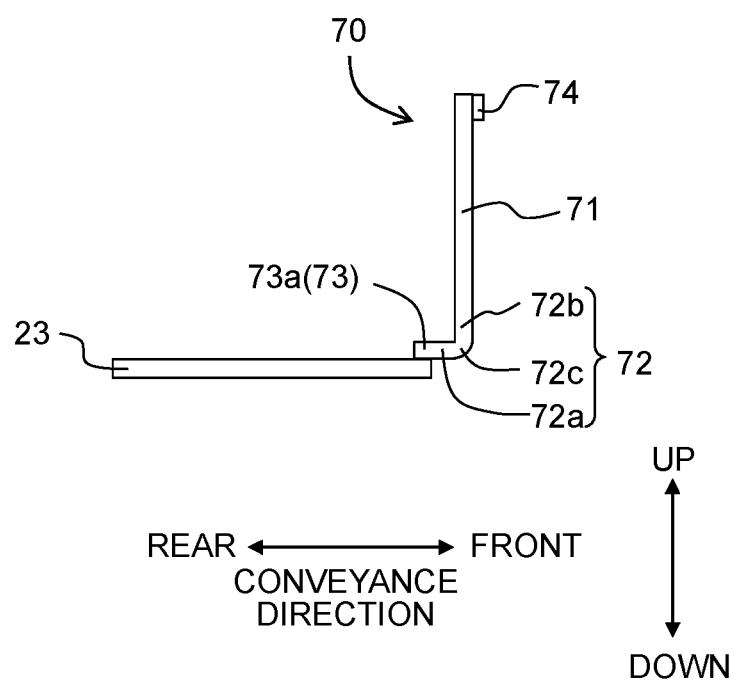
FIG. 10 is a view depicting a state that second parts are bent in a case that the flexible wiring board is mounted on the ink-jet printer.

Note that the flexible wiring board 70 of the present embodiment is mounted on the printer 11 in a state that the flexible wiring board 70 is bent upward at the second parts 72, as depicted in FIG. 10. In this state, the first part 72a of each of the second parts 72 extends in the conveyance direction along a horizontal plane, and the second part 72b of each of the second parts 72 extends in an up direction (upward) such that the second part 72b is away from the head module 23. The up-down direction is an example of a "third direction" of the present disclosure. Further, in FIG. 8, parts, of the respective second parts 72, overlapping with the bending line F each correspond to a bending part 72c depicted in FIG. 10. In other words, each of the fifth parts 72c is connected or linked to the end in the conveyance direction, of one of third parts 72a corresponding thereto, on the side opposite to the joining part 73a, and is connected or linked to the end on the lower side (lower end) of one of the fourth parts 72b corresponding thereto. The end in the conveyance direction, of each of the third parts 72a, on the side opposite to the joining part 73a is an example of a "first end" of the present disclosure. The lower end of each of the fourth parts 72b is an example of a "second end" of the present disclosure. Further, the end on the upper side (upper end) of each of the fourth parts 72b is an example of a "third end" of the present disclosure.

According to the printer 11 of the present embodiment as explained above, one piece of the flexible wiring board 70 is connected to one piece of the head unit 20. Further, one piece of the head unit 20 includes six pieces of the head module 23. Namely, a common flexible wiring board 70 is connected to the six head modules 23. Accordingly, it is possible to reduce the number of the flexible wiring board, as compared with a case of connecting the flexible wiring board for each of the head modules, thereby making is possible to reduce the number of the connectors of the controller, as a result.

Further, in the printer 11 of the present embodiment, the flexible wiring board 70 has the sixth part 71, the plurality of second parts 72 and the eighth part 73. The width in the apparatus width direction of each of the second parts 72 is smaller than the width in the apparatus width direction of the sixth part 71. Further, the flexible wiring board 70 is mounted on the printer 11 in a state that the flexible wiring board 70 is bent in the up direction at each of the second parts 72. Owing to this configuration, the flexible wiring board 70 has a satisfactory bendability; even in such a case that any external force acts on the flexible wiring board while the flexible wiring board is (being) mounted on the printer 11, the flexible wiring board 70 and the plurality of head modules 23 are less likely to peel off or detached from each other at the joining part therebetween.

Further, in the printer 11 of the present embodiment, the flexible wiring board 70 is connected to the ends, of the respective head modules 23, in the nozzle-alignment direction. Owing to this configuration, the width in the orthogonal direction orthogonal to the nozzle-alignment direction of each of the head modules 23 can be made small, as compared with a case of connecting the flexible wiring board between two nozzle rows in each of the head modules 23.

Furthermore, in the printer 11 of the present embodiment, the five through holes 77 are formed in the flexible wiring board 70. Owing to this configuration, it is possible to easily position the flexible wiring board 70 with respect to the six head modules 23 while the flexible wiring board 70 is being jointed to the six head modules 23.

Moreover, in the printer 11 of the present embodiment, the eighth part 73 continued from the six second parts 72 is provided on the flexible wiring board 70. Further, the COM-A wiring 76a and the COM-B wiring 76b are arranged on the eighth part 73 commonly with respect to the plurality of head modules 23. Owing to this configuration, it is possible to reduce the number of the wirings, as compared with a case of providing these wirings with respect to each of the head modules 23.

Note that in the present embodiment, it is allowable that the widths of the COM-A wiring 76a and the COM-B wiring 76b arranged in the flexible wiring board 70 are not uniform. Namely, the widths of these wirings 76a and 76b may be adjusted such that the impedances in routes arriving at the six head modules 23 (driver ICs 65) are substantially same. For example, each of the COM-A wiring 76a and the COM-B wiring 76b may have such a width which becomes greater from the outer side toward the central side in the apparatus width direction, at the eighth part 73 of the flexible wiring board 70. In a case that these wirings 76a and 76b are arranged along the outer shape of the flexible wiring board 70 and are cut at the central portion in the apparatus width direction as in the present embodiment, a distance up to a head module 23, among the six head modules 23, which is joined to the flexible wiring board 70 on the central side in the apparatus width direction is longer than a distance up to another head module 23, among the six head modules 23, which is joined to the flexible wiring board 70 at the outer side in the apparatus width direction. Accordingly, by making the width of each of the wirings 76a and 76b to be greater from the outer side toward the central side in the apparatus width direction, it is possible to made the difference in impedance among the routes to be small. Further, in view of further making the difference in impedance among the routes to be smaller, it is allowable that the plurality of head modules 23 have the connecting terminals which are to be connected with respect to the flexible wiring board 70 and which are disposed at mutually different positions among the plurality of head modules 23. For example, it is allowable that the connection terminal of a head module 23, among the plurality of head modules 23, which is located at the central side in the apparatus width direction, is arranged such that the distance from the connecting terminal up to the driver IC 65 is shorter than that in another head module 23, among the plurality of head modules 23, which is arranged at the outer side in the apparatus width direction.

The above-described embodiment applies the present disclosure to an ink-jet head which discharges or jets an ink onto a recording paper sheet so as to print an image, etc., on the recording paper sheet. However, the present disclosure is applicable also to a liquid discharging apparatus usable in a variety of kinds of usage or application other than printing of image, etc. For example, it is also possible to apply the present disclosure to a liquid discharging apparatus configured to form a conductive pattern on a surface of a substrate by discharging or jetting a conductive liquid onto the substrate.

What is claimed is:
1. A liquid discharging apparatus comprising:
   liquid discharging modules which are arranged in a first direction along a predetermined plane; and
   a wiring member commonly joined to the liquid discharging modules,
   wherein the wiring member includes:
      first parts joined to the liquid discharging modules, respectively, in a state that the first parts are arranged side by side in the first direction along the predetermined plane; and
      second parts including:
         third parts extending from the first parts, respectively, in a second direction orthogonal to the first direction and along the predetermined plane,
         fourth parts extending in a third direction away from the predetermined plane, and
         fifth parts connected to first ends of the third parts and second ends of the fourth parts, respectively, the first ends being located on a side opposite to the first parts in the second direction, the second ends being located on a side close to the predetermined plane in the third direction; and
      a sixth part commonly connected to third ends of the fourth parts, the third ends being located on a side far from the predetermined plane in the third direction; and
   width in the first direction of each of the second parts is smaller than width in the first direction of the sixth part.

2. The liquid discharging apparatus according to claim 1, wherein the wiring member is further provided with at least one seventh part which links two first parts with each other, the two first parts being included in the first parts and being adjacent to each other in the first direction; and an eighth part extending continuously in the first direction is formed of the first parts and the at least one seventh part.

3. The liquid discharging apparatus according to claim 2, wherein the eighth part has a driving signal wiring through which a common driving signal is supplied to the liquid discharging modules.

4. The liquid discharging apparatus according to claim 3, wherein the driving signal wiring is formed as two driving signal wirings each of which extends in the first direction; and the two driving signal wirings are not overlapped with each other in the second direction.

5. The liquid discharging apparatus according to claim 3, wherein each of the second parts has a constant potential wiring through which a constant-potential signal is supplied to one of the liquid discharging modules.

6. The liquid discharging apparatus according to claim 3, wherein each of the second parts has a control wiring through which a control signal is supplied to one of the liquid discharging modules.

7. The liquid discharging apparatus according to claim 1, wherein in each of the second parts, the width in the first direction is smaller than a sum of length in the first direction of one of the third parts and length in the third direction of one of the fourth parts.

8. The liquid discharging apparatus according to claim 1, wherein each of the liquid discharging modules extends along the predetermined plane in a fourth direction crossing the first and second directions.

9. The liquid discharging apparatus according to claim 8, wherein each of the liquid discharging modules has piezoelectric elements arranged along the predetermined plane in the fourth direction.

10. The liquid discharging apparatus according to claim 9, wherein each of the liquid discharging modules has a driver IC which is overlapped with the piezoelectric elements and electrically connected to the piezoelectric elements.

11. A wiring member comprising:
a sixth part which extends in a predetermined direction;
second parts each of which extends in the predetermined direction from an end, of the sixth part, on one side in the predetermined direction; and
an eighth part which extends in an orthogonal direction orthogonal to the predetermined direction and which connects ends of the second parts on the one side in the predetermined direction, with each other,
wherein in each of the second parts, width thereof in the orthogonal direction is smaller than length thereof in the predetermined direction, and the width thereof in the orthogonal direction is smaller than width in the orthogonal direction of the sixth part.

* * * * *